United States Patent
Walley

(10) Patent No.: US 8,258,881 B2
(45) Date of Patent: Sep. 4, 2012

(54) METHOD AND SYSTEM FOR DRIFT REDUCTION IN A LOW POWER OSCILLATOR (LPO) UTILIZED IN A WIRELESS COMMUNICATION DEVICE

(75) Inventor: John Walley, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 121 days.

(21) Appl. No.: 12/403,969

(22) Filed: Mar. 13, 2009

(65) Prior Publication Data

US 2010/0231307 A1      Sep. 16, 2010

(51) Int. Cl.
   *H03L 7/24*    (2006.01)
(52) U.S. Cl. .................. 331/47; 331/2; 331/46; 331/50
(58) Field of Classification Search .............. 331/2, 47, 331/50, 46
   See application file for complete search history.

(56) References Cited

U.S. PATENT DOCUMENTS

| | | | |
|---|---|---|---|
| 6,545,550 B1 * | 4/2003 | Frerking | 331/44 |
| 6,734,738 B2 * | 5/2004 | Ichimaru | 331/14 |
| 6,735,454 B1 * | 5/2004 | Yu et al. | 455/574 |
| 2005/0270108 A1 * | 12/2005 | Wilson et al. | 331/2 |
| 2006/0223454 A1 * | 10/2006 | Westwick et al. | 455/76 |
| 2009/0146746 A1 * | 6/2009 | Unkrich et al. | 331/70 |

* cited by examiner

*Primary Examiner* — Joseph Chang
*Assistant Examiner* — Jeffrey Shin
(74) *Attorney, Agent, or Firm* — Thomas, Kayden, Horstemeyer & Risley, LLP

(57) ABSTRACT

A radio circuit may be driven by a high frequency oscillator such as a crystal oscillator that may have sleep and wake time intervals. The sleep time interval length may be adjusted. A low frequency oscillator or low power oscillator (LPO) that may experience frequency drift may regulate the sleep and/or wake time intervals. The frequency drift may be detected based on two or more LPO calibrations and/or one or more clock adjustments. The LPO frequency drift may be detected based on an LPO frequency sampled after a first LPO calibration and a corresponding LPO clock adjustment, a second LPO frequency sampled after a second LPO calibration and a time interval between the two frequency samples. The LPO may be calibrated based on the HFCXO output. Sleep time intervals may be adjusted by adding and/or subtracting a time interval to an expected time to wake the radio circuit.

22 Claims, 5 Drawing Sheets

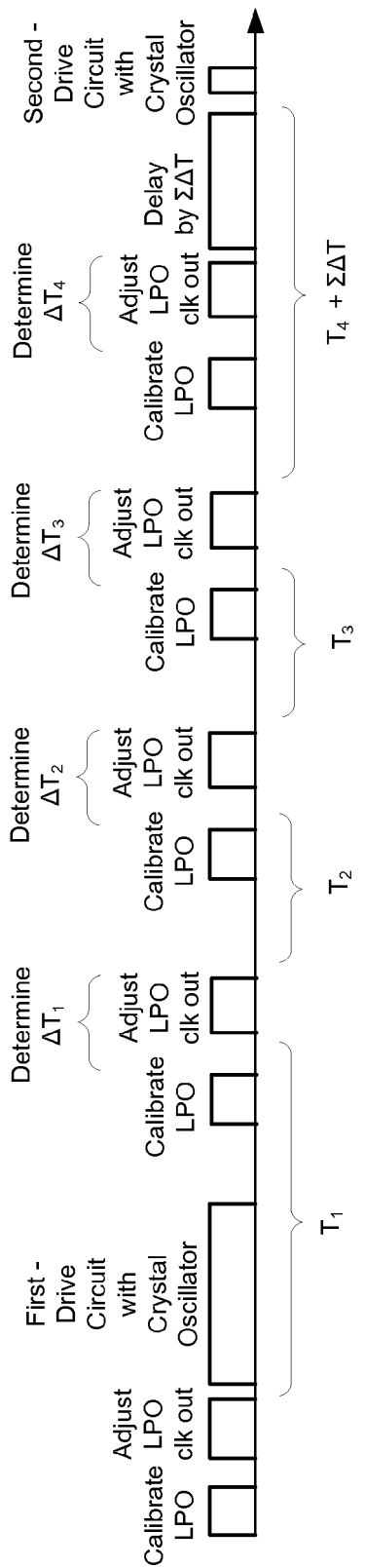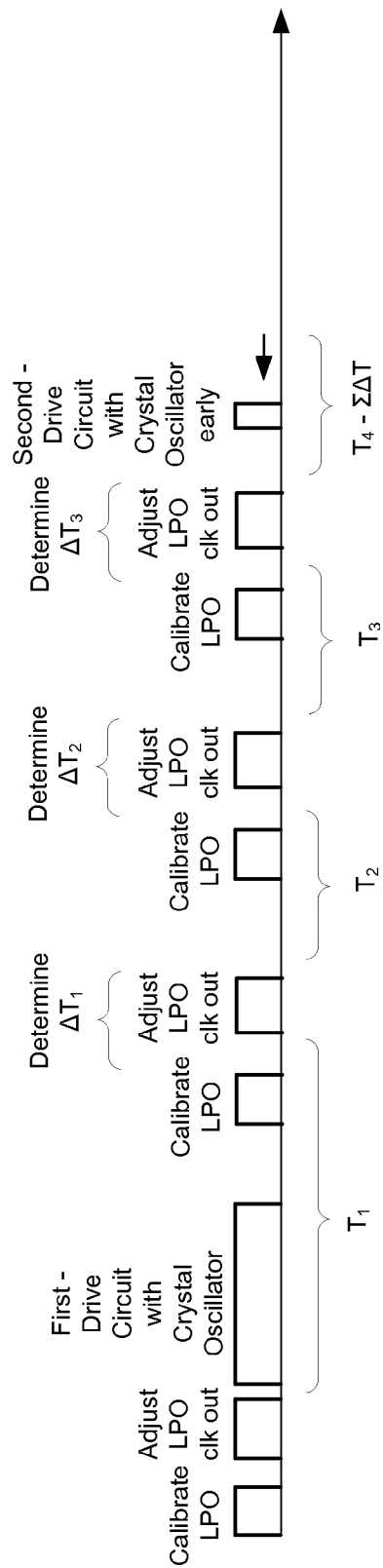

METHOD AND SYSTEM FOR DRIFT REDUCTION IN A LOW POWER OSCILLATOR (LPO) UTILIZED IN A WIRELESS COMMUNICATION DEVICE

CROSS-REFERENCE TO RELATED APPLICATIONS/INCORPORATION BY REFERENCE

Not applicable

FIELD OF THE INVENTION

Certain embodiments of the invention relate to communication devices. More specifically, certain embodiments of the invention relate to a method and system for drift reduction in a low power oscillator (LPO) utilized in a wireless communication device.

BACKGROUND OF THE INVENTION

In recent years, there has been a phenomenal growth in mobile or handheld computing and communication devices such as, for example, personal digital assistants (PDAs), mobile phones, smart phones and personal media players. As these devices increasingly become indispensable, multiple usage scenarios via various wireless technologies have resulted in users gravitating toward these devices. For example, multiple technologies such as wireless WAN (cellular or WiMAX), high-speed wireless LAN (WiFi), short-range wireless (Bluetooth), GPS, FM and mobile TV, which are integrated within a device may enable a user of a device to make phone calls, download songs, listen through headsets, check location, listen to talk shows and/or watch sportscasts. In certain circumstances, some of these technologies may operate at the same time. Device vendors are then faced with the task of balancing the need for more features in these devices to optimize user experiences and/or productivity, with the conflicting forces of lower cost, smaller device sizes and longer battery life.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a method and system for drift reduction in a low power oscillator (LPO) utilized in a wireless communication device, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 4A is a timing diagram illustrating a multipoint calibration that results in a delay of radio circuit activity, in accordance with an embodiment of the invention.

FIG. 4B is a timing diagram illustrating a multipoint calibration that advances radio circuit activity to an earlier time, in accordance with an embodiment of the invention.

DETAILED DESCRIPTION OF THE INVENTION

Figure 1:
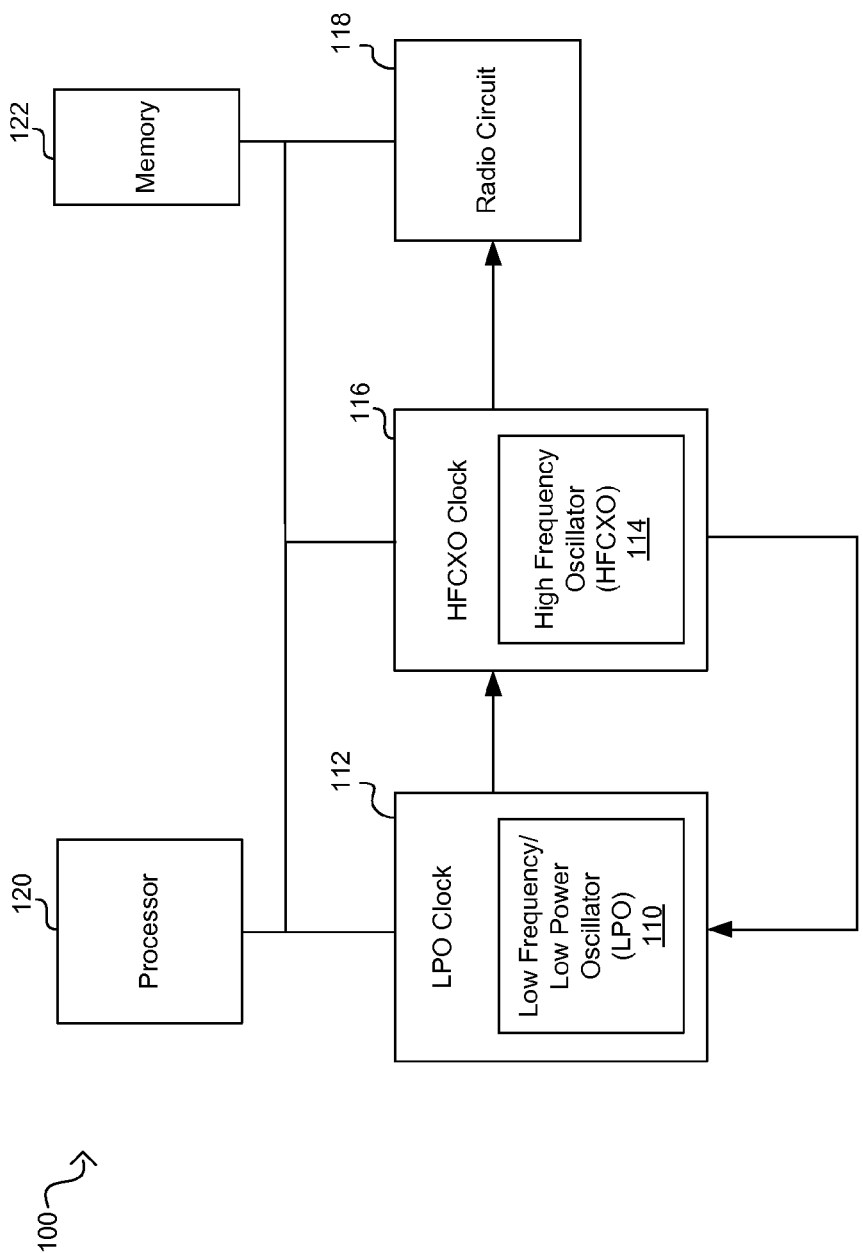
FIG. 1 is a block diagram illustrating an exemplary system for regulating sleep intervals for a high frequency crystal oscillator driven circuit, in accordance with an embodiment of the invention.

Certain embodiments of the invention may be found in a method and system for drift reduction in a low power oscillator (LPO) utilized in a wireless communication device. Various communication devices, for example, a Bluetooth, cellular, WIMAX, GPS, near field communication (NFC) and/or Zigbee device may utilize two oscillators, a first one that may be more accurate and more spectrally pure such as a high frequency crystal oscillator (HFCXO), and a second one that may be less accurate and less spectrally pure and may utilize less power to operate such as a low power oscillator (LPO). The term "high frequency oscillator" may be utilized in place of "high frequency crystal oscillator (HFCXO)" and the term "low frequency oscillator" may be utilized in place of "low power oscillator (LPO). The low power oscillator (LPO) may be utilized for digital processing tasks which may not require the high performance provided by the HFCXO. In various embodiments of the invention, circuits driven by the HFCXO, for example radio circuits, may sleep in between periods of activity in order to reduce power consumption. Time intervals for circuits to sleep and/or wake up may be regulated by the LPO which may be, for example, a 32 KHz LPO.

Exemplary aspects of the invention may enable an LPO to realize a more accurate time at which to wake-up and utilize the HFCXO as a high frequency and/or accurate timing source. In this regard, a sleep time interval for a circuit which may be driven by the HFCXO may be adjusted based on a detected frequency drift in the LPO. For example, the sleep time interval may be adjusted for the circuit while the HFCXO is driven by the LPO. In various embodiments of the invention, the LPO may be calibrated based on an output of the HFCXO. The LPO frequency drift may be detected based on a first frequency sampled at a first time instant and a second frequency sampled at a second time instant, and a time interval between the first and second time instants. In addition, the first time instant may occur after a first LPO calibration and the second time instant may occur after a second LPO calibration. Furthermore, the first time instant may occur after a first LPO clock adjustment which may occur after the first LPO calibration. The detected LPO frequency drift may be utilized to determine a time interval for adjusting the HFCXO sleep time interval. In this regard, the determined time interval may be based on two or more LPO calibrations and/or one or more LPO clock adjustments. The sleep time interval may be increased by adding a time delay to an expected time to wake the HFCXO and/or the HFCXO driven circuit. Also, the HFCXO and/or the HFCXO driven circuit sleep time interval may be decreased by subtracting a time interval from the expected wake time. According to an embodiment of the invention, the circuit driven by the HFCXO may be a radio circuit. The radio circuit may be enabled to perform various tasks more quickly in instances when the time to wake the HFCXO circuit is more accurate due to the two or more calibrations between sleep and wake cycles.

FIG. 1 is a block diagram illustrating an exemplary system for regulating sleep intervals for a high frequency crystal oscillator driven circuit, in accordance with an embodiment of the invention. Referring to FIG. 1, there is shown a system 100 that comprises a low power oscillator (LPO) 110, an LPO clock 112, a high frequency crystal oscillator (CXO) 114, a high frequency crystal oscillator (HFCXO) clock 116, a circuit 118, a processor 120 and a memory 122.

The system 100 may comprise a portion of a wireless device, for example, a Bluetooth, cellular, WIMAX, GPS, NFC and/or Zigbee device. In various embodiments of the invention, various elements of the system 100 may be located on different devices. For example, the LPO 110 may be located on an inexpensive Bluetooth device while the HFCXO 116 may be located on a communicatively coupled mobile phone.

The low power oscillator (LPO) 110 may comprise suitable logic circuitry and/or code that may be operable to generate timing signals for regulating sleep and wake state intervals for one or more circuits such as the circuit 118. In addition, the LPO 110 may be utilized to drive various clocks for regulating various digital processing functions within the system 100. The LPO 110 may be, for example, a 32 kHz crystal oscillator that may be somewhat noisy and may easily drift in frequency. The LPO 110 may be calibrated based on input signals from the HSCXO clock 116.

The LPO clock 112 may comprise suitable logic, circuitry and/or code that may be operable to generate clock output signals based on input from the LPO 110. The generated clock signals may regulate time intervals for sleep and wake states for one or more circuits such as the circuit 118. Timing of the LPO clock 112 output signals may be calibrated and/or adjusted based input from the HFCXO 116 and/or the processor 120. In addition, the LPO clock 112 may be enabled to delay or advance to an earlier time, the sleep and/or wake intervals for the one or more circuits such as the circuit 118. The LPO clock 112 may communicate frequency and/or timing information that may enable determination of delay and/or advanced wake times. For example a frequency of the LPO clock 112 output after a first timing adjustment and/or a frequency of the LPO clock 112 output before a second timing adjustment may be communicated to the processor 120 and/or memory 122.

The high frequency crystal oscillator (HFCXO) 114 may comprise suitable logic, circuitry and/or code to generate a time reference for one or more circuits requiring high frequency, accurate timing signals. For example, the HFCXO 114 may be utilized to drive a clock such as the HFCXO clock 116 that may drive the circuit 118. In this regard, the high frequency CXO 114 may enable radio communication. In addition, the HFCXO 114 may generate a time reference for calibrating the LPO 110. The HFCXO 114 may provide a higher level of accuracy and/or spectral purity than the LPO 110 however; it may require a higher level of current than the LPO 110 to operate. Therefore, energy may be conserved in the system 100 by utilizing the LPO 110 and/or turning off the HFCXO 114 for tasks and/or circuits that do not require such a high level of performance. Time intervals during which the HFCXO 114 is off and/or on may be referred to as sleep and/or wake cycles.

The high frequency crystal oscillator (HFCXO) clock 116 may comprise suitable logic circuitry and/or code that may be operable to generate timing signals for the circuit 118 and/or the LPO 110 based on a time reference from the HFCXO 114. For example, the HFCXO clock 116 may drive the circuit 118 which may comprise a radio frequency circuit and/or may support Bluetooth communications for example. In addition, the HFCXO clock 116 output may be utilized for calibration of the LPO 110 and for determining LPO clock 112 timing adjustments.

The circuit 118 may comprise suitable logic circuitry and/or code that may be operable to process and or communicate data based on clock signals from the HFCXO clock 116 output. For example, the circuit 118 may require and/or utilize high frequency, spectrally pure signals from the HFCXO clock 116. In this regard, the circuit 118 may be an RF circuit that may utilize, for example, Bluetooth, cellular, WIMAX, GPS, NFC, Zigbee and/or other wireless technologies to communicate.

The processor 120 may comprise suitable logic circuitry and/or code that may be operable to determine sleep and/or wake time intervals for driving the circuit 118 by the HFCXO 114 and/or the HFCXO clock 116 and may compensate for frequency drift in the LPO 110 and/or LPO clock 112. Accordingly, the processor 120 may receive frequency and/or time information about the LPO 110 and/or LPO clock 112 one or more calibrations of the LPO 110. The processor 120 may approximate the frequency drift of the LPO 110 and may compensate for the drift. For example, the processor 120 may determine a time interval ($\Delta T$) that may be added to or subtracted from an expected time interval (T) for waking up the circuit 118. Compensating for frequency drift in the LPO 110 with the added $\Delta T$ may enable the circuit 118 to sleep longer and wake up at a more accurate time which may reduce time needed for the circuit 118 to wake up. A reduction in wake time for the HFCXO 114 and circuit 118 may enable significant power savings. For example, the circuit 118 may need an interval on the order of microseconds to accomplish a task; however, a timing uncertainty on the order of a millisecond may be introduced due to the frequency drift. In addition, the processor 120 may manage various other functions for the system 100.

In various embodiments of the invention, the processor 120 may be operable to detect and/or estimate a frequency drift in the LPO 110 and/or the LPO clock 112 based on one or more attributes of and/or one or more measurements taken within the system 100. For example, variations in a voltage level and/or a temperature level may be utilized to detect a frequency drift.

The memory 122 may comprise suitable logic, circuitry and/or code that may be operable to store frequency and/or timing data for the system 100. In addition, the memory 122 may store instructions for determining the sleep and/or wake time intervals as well as for calibration and/or timing adjustments for the LPO 110 and/or LPO clock 112. The memory 122 may store additional information to support system 100 operations.

In operation, the circuit 118 may be for example, an RF circuit 118 that may be driven by the HFCXO clock 116. The circuit 118 and/or HFCXO 114 may wake up to perform 1 or more tasks, for example, to search for a beacon signal that may begin at a specified time, and then may go back to sleep. It may be beneficial to reduce the wake time duration, for example, to conserve energy. The LPO 110 and/or LPO clock 112 may regulate the sleep and wake cycles of the HFCXO 114 and/or the circuit 118. The LPO 110 may experience significant frequency drift which may introduce timing uncertainties. The duration of a sleep cycle may be on the order of a second, for example. Due to timing uncertainties, the wake cycle duration may vary on the order of 1 millisecond to 1 microsecond for example. In various embodiments of the invention, a sleep and/or wake cycle duration may comprise an expected duration T and an added or subtracted sleep time ΔT wherein ΔT may compensate for the frequency drift and may reduce the timing uncertainty. The processor 120 may determine ΔT.

The determination of ΔT may utilize information derived from two or more calibrations and/or timing adjustments of the LPO 110 and/or LPO clock 112. For example, a difference in frequency taken just after a first calibrated timing adjustment $f_1$ and just after a subsequent calibration $f_2$ may enable approximation of the frequency drift over a known duration of time T. In accordance with an embodiment of the invention, ΔT may be determined based on the following expression.

$$\Delta T = T(f_2 - f_1)$$

where $f_1$ may be a calibrated and/or corrected frequency at a time prior to a frequency drift, $f_2$ is a frequency measured after the frequency drift, T may be a time interval and/or number of clock cycles between $f_1$ and $f_2$ and ΔT may be a timing error due to the frequency drift, for example, a time interval and/or a number of LPO clock cycles. For example, in instances where the LPO 110 frequency may be too high, the LPO clock 112 may wait an additional interval ΔT clock cycles after time interval T before waking the RF circuit 118. The invention is not limited to any specific method for approximating the frequency drift and any suitable method may be utilized. For example any suitable linear approximation and/or a polynomial approximation may be utilized.

Figure 2:
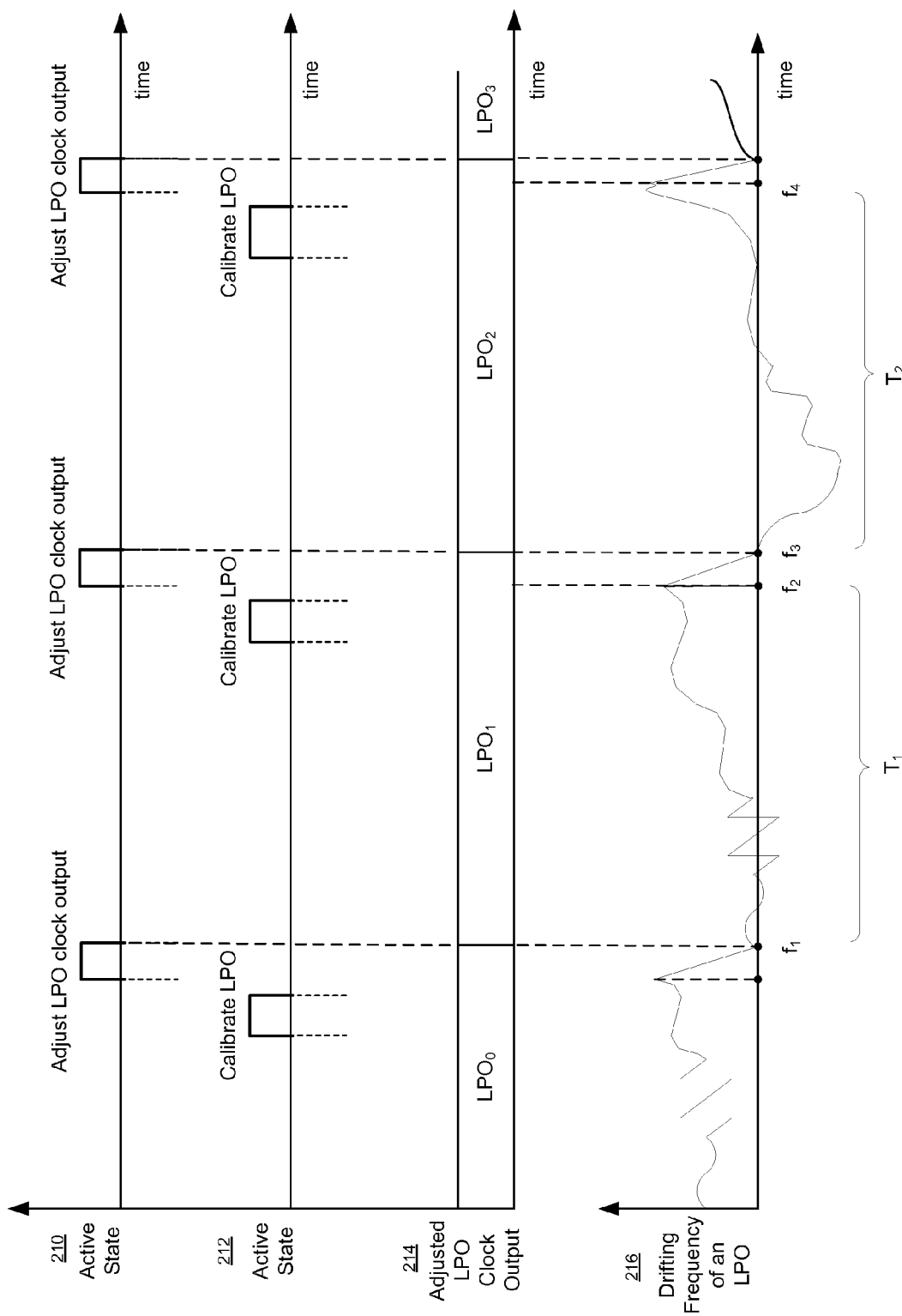
FIG. 2 is a timing diagram illustrating exemplary LPO calibration and adjustment time intervals as well as frequency drift for an LPO, in accordance with an embodiment of the invention.

FIG. 2 is a timing diagram illustrating exemplary LPO calibration and adjustment time intervals as well as frequency drift for an LPO, in accordance with an embodiment of the invention. Referring to FIG. 2, there is shown four timelines 210, 212, 214 and 216 that indicate exemplary relative times for activity and/or events within the system 100.

In timeline 212 there is shown a sequence of time intervals during which the LPO 110 may be calibrated based on input from the HFCXO clock 116. In timeline 210 there is shown a sequence of time intervals during which the LPO clock 112 timing may be adjusted based on a recent calibration of the LPO 110 shown in timeline 212. For example, after each calibration of the LPO 110, the LPO clock 112 timing may be adjusted. In timeline 214 there is shown the output of the LPO clock 112 that may be updated based on a most recent calibrated timing adjustment shown in timeline 210.

In time line 216, there is shown frequency drift in the LPO 110 relative to the calibration and timing adjustments shown in time lines 210 and 212. In this regard, the timeline 216 indicates that the frequency drift is at a low point at a time instant just after the LPO clock 112 receives a calibrated timing adjustment and the frequency corresponding to that low point is labeled $f_1$. In between the first calibrated timing adjustment and the second calibrated timing adjustment, the frequency drifts to a high point. The frequency determined at the highpoint of the frequency drift is labeled $f_2$. Also, a time interval T is indicated that spans the time between the $f_1$ and $f_2$. Frequency values corresponding to $f_1$, $f_2$ and the time interval T may be utilized to determine a time interval ΔT as described with respect to FIG. 1. Notwithstanding the relative time intervals shown in FIG. 2, in various embodiments of the invention, two or more active intervals shown in FIG. 2 may overlap in time.

Figure 3:
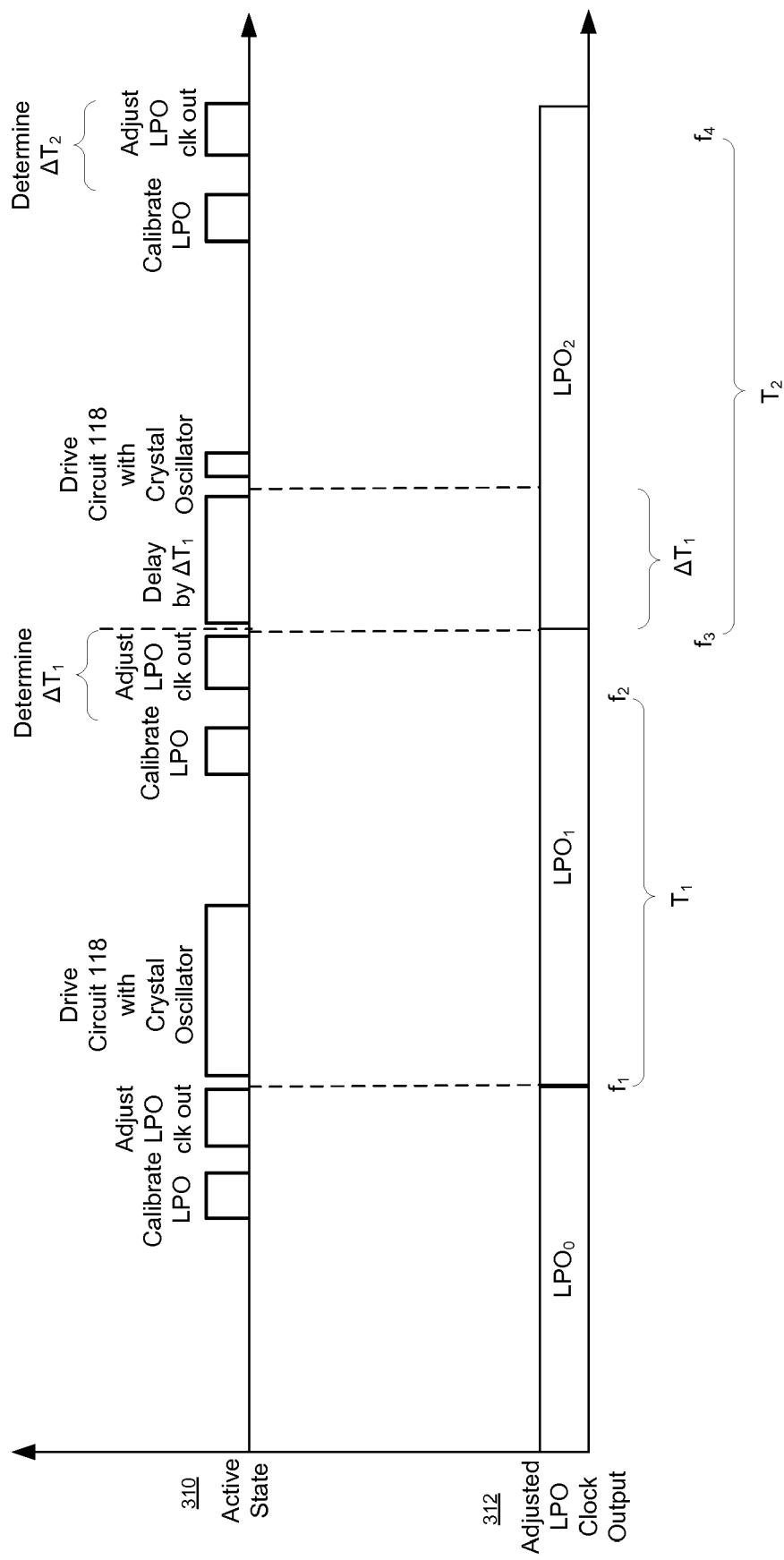
FIG. 3 is a timing diagram illustrating an exemplary two point calibration for reducing a time interval for radio circuit activity and/or events, in accordance with an embodiment of the invention.

FIG. 3 is a timing diagram illustrating an exemplary two point calibration for reducing a time interval for radio circuit activity, in accordance with an embodiment of the invention. Referring to FIG. 3 there is shown two timelines 310 and 312. The timeline 312 shows the LPO clock 112 timing output as described with respect to FIG. 2.

The timeline 310 shows a plurality of events that may enable sleep and/or wake cycles for the circuit 118 and HFCXO 114. In timeline 310, following the first calibration and timing adjustment that were described with respect to FIG. 2, the low point frequency $f_1$ may be stored in the memory 122. At a time instant near the first LPO clock adjustment, the HFCXO 114 may be engaged and the HFCXO clock 116 output may drive the circuit 118. The circuit 118 may be awake for a specified interval of time that may comprise a large uncertainty and may be turned off when circuit 118 tasks are finished. At or near the end of the time interval T when the frequency drift may be at a high point, the HFCXO 114 may be turned on to calibrate the LPO 110 and to determine $f_2$ and the HFCXO 114 may be turned off. A value for ΔT may be determined based on $f_1$, $f_2$ and T as described with respect to FIG. 2. The timing of the LPO clock 112 output may be adjusted to output $LPO_2$.

After the adjustment, the LPO clock 112 output may again be at low level of frequency drift and the system may record $f_3$. The LPO clock 112 may reduce the timing uncertainty by waiting the time interval ΔT before awakening the HFCXO 114. Once the HFCXO 114 is awake, the HFCXO 116 may drive the wake cycle of the circuit 118. In this manner, the circuit 118 wake cycle may be shortened due to the reduced timing uncertainty. For example, in instances where the circuit 118 may be an RF circuit, the timing uncertainty may be reduced and the timing reference for the circuit 118 may be more accurate. In this regard, the circuit 118 may not need to wake up early to search for signals and determine timing and may be able to finish its tasks over a shortened interval of time. Notwithstanding the order of active time intervals and/or events shown in FIG. 3, in various embodiments of the invention, two or more of the active intervals shown in FIG. 3 may overlap in time.

FIG. 4A is a timing diagram illustrating a multipoint calibration that results in a delay of radio circuit activity, in accordance with an embodiment of the invention. Referring to FIG. 4A, there is shown a time line comprising events and/or active time intervals. The first LPO 110 calibration, first LPO clock 112 timing adjustment and first circuit 118 active interval are similar and/or substantially the same as those described with respect to timeline 310 shown in FIG. 3. Referring to FIG. 4A, there may be a long time interval between a first circuit 118 active period and the second circuit 118 active period. In addition, there may be multiple calibrated timing adjustments and multiple time intervals T in between the first and second circuit 118 active periods. For example, there are four time interval Ts shown in FIG. 4A. A time interval, ΔT, may be determined after each LPO 110 calibration. The ΔT's may be accumulated and a net ΔT may be determined. Furthermore, a time interval, ΔT and/or a corresponding frequency drift may be determined based on a plurality of prior LPO 110 calibrations. In instances where a frequency of the LPO 110 may have increased over the span of T1 through T4, it may be determined by the processor 120 that the LPO clock 112 may have run too fast and a time delay based on the sum of all four ΔTs may be added after the last time interval $T_4$.

Aspects of the invention may comprise various methods of scheduling and/or triggering of the LPO 110 calibrations and/or LPO clock 112 adjustments. A state machine may control when an LPO 110 calibration and/or LPO clock 112 adjustment may occur. In various embodiments of the invention, LPO 110 calibrations and/or LPO clock 112 adjustments may be triggered based on a determined frequency error or calibration results. For example, in instances when $\Delta T_1$ may be comprise a short duration or the frequency error may be small, a second or third LPO 110 calibration and/or LPO clock 112 adjustment may be skipped or may be scheduled at a later time. In this regard, a small amount of frequency drift may result in fewer calibrations and/or adjustments between wake time intervals and/or a greater amount of frequency drift may result in a greater number of calibrations and/or adjustments between wake time intervals. Furthermore, one or more LPO 110 calibrations may occur without a corresponding LPO clock 112 adjustment. For example, the LPO clock 112 may be adjusted after a plurality of LPO 110 calibrations or the LPO clock 112 may not be adjusted at all.

FIG. 4B is a timing diagram illustrating a multipoint calibration that advances radio circuit activity to an earlier time, in accordance with an embodiment of the invention. Referring to FIG. 4B there is shown a time line comprising events and/or active time intervals similar to the events and/or time intervals described with respect to FIG. 4A. However, in FIG. 4B, frequency of the LPO 110 may have slowed down instead of speeding up. By the end of time interval T3, it may be determined that the LPO clock 112 may have been running too slow. The processor 120 may determine that it should not wait until the end of T4 to turn on the circuit 118 and may forego the last set of LPO 110 calibration and LPO clock 112 timing adjustment shown in FIG. 4A. In this manner, the processor 120 may determine that a time interval determined based on an accumulation of the first three $\Delta T$s may be subtracted from the time interval $T_4$ and that activation of the circuit 118 may occur prior to the end of the expected interval $T_4$.

Figure 5:
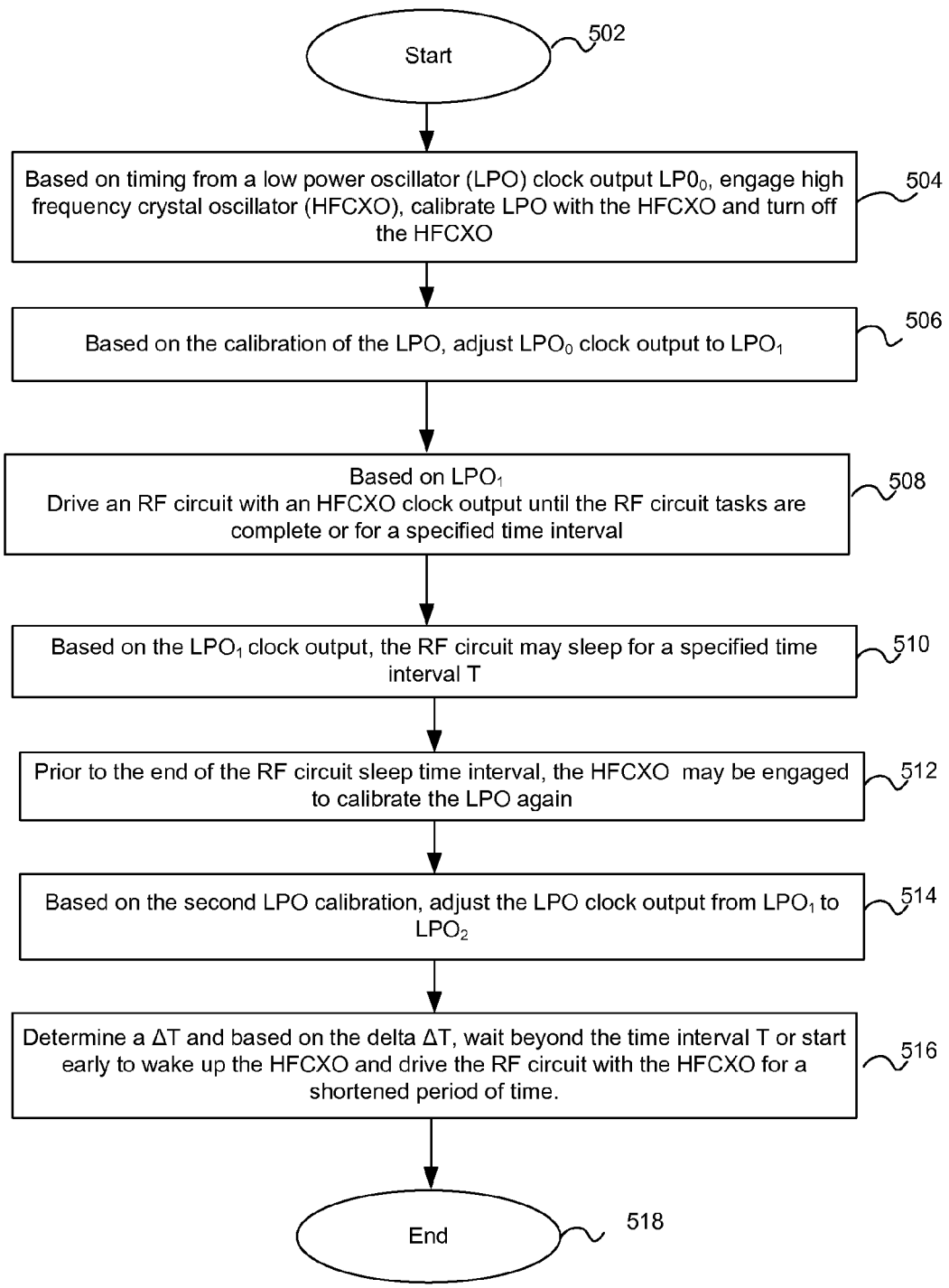
FIG. 5 is a flow chart illustrating exemplary steps for reducing a time interval utilized for driving a circuit with a high frequency crystal oscillator, in accordance with an embodiment of the invention.

FIG. 5 is a flow chart illustrating exemplary steps for reducing a time interval utilized for driving a circuit with a crystal oscillator, in accordance with an embodiment of the invention. Referring to FIG. 5 exemplary steps may begin at step 502. In step 504, based on timing from a low power oscillator (LPO) clock 112 output $LPO_0$, engage the high frequency crystal oscillator (HFCXO) 114, calibrate LPO 110 with the HFCXO 114 and/or HFCXO 116 and turn off HFCXO 114.

In step 506, based on the calibration of the LPO 110, adjust $LPO_0$ clock output to $LPO_1$. In step 508, based on $LPO_1$, drive an RF circuit 118 with an HFCXO clock 116 output until RF circuit 118 tasks are complete and/or for a specified time interval. In step 510, based on the $LPO_1$ clock output, the RF circuit 118 may sleep for a specified time interval T. In step 512, prior to the end of the RF circuit 118 sleep time interval; the HFCXO 114 and/or HFCXO clock 116 may be engaged to calibrate the LPO 110 again. In step 514, based on the second LPO 110 calibration, adjust the LPO clock 112 output from $LPO_1$ to $LPO_2$. In step 516, a $\Delta T$ may be determined and based on the determined delta $\Delta T$, wait beyond the time interval T or start early to wake up the HFCXO 114 and or HFCXO clock 116 and drive the RF circuit 118 with the HFCXO 114 and/or HFCXO clock 116 for a shortened period of time. Step 518 may be an end of exemplary steps.

In an embodiment of the invention, sleep time intervals between periods of activity may be increased in a circuit 118 that may be driven by a HFCXO 114 and/or HFCXO clock 116. Increasing the sleep time intervals between periods of activity may reduce a timing uncertainty in a wake time interval for the HFCXO 114 driven circuit 118. LPO 110 may regulate the sleep time intervals. Compensation may be made for frequency drift in the LPO 110. Frequency drift compensation may be determined based on an LPO 110 first frequency (f1) known at a first time instant and a second LPO 110 frequency (f2) known at a second time instant and a time interval (T) between the first time instant and the second time instant. In this manner, the first time instant may occur after a first calibration of the LPO 110 and corresponding LPO clock 112 adjustment and the second time instant may occur after a second calibration of the LPO 110. Moreover, a time interval that may be utilized to increase the sleep time intervals may be determined based on the first frequency $f_1$, second frequency $f_2$ and the time interval T. The LPO 110 may be calibrated based on the HFCXO 114 output. Two or more LPO 110 calibrations and/or LPO clock 112 adjustments may be utilized to determine the frequency drift compensation for increasing the sleep time intervals. The sleep time intervals may be increased by adding and/or subtracting the time interval to an expected time to wake the HFCXO 114 and/or the circuit 118 driven by the HFCXO 114 and/or HFCXO clock 116. According to an embodiment of the invention, the circuit driven by the high frequency crystal oscillator 114 may be a radio circuit.

In another embodiment of the invention, aspects of the invention may enable a low frequency oscillator 110 to realize a more accurate time at which to wake-up a high frequency and/or accurate timing source 114. In this regard, a sleep time interval for a circuit 118 which may be driven by the high frequency oscillator 114 may be adjusted based on a detected frequency drift in the low frequency oscillator 110. For example, the sleep time interval may be adjusted for the circuit 118 while the high frequency oscillator 114 is driven by the high frequency oscillator 114.

In various embodiments of the invention, the high frequency oscillator 114 may be calibrated a based on an output of the high frequency oscillator 114. The high frequency oscillator 114 frequency drift may be detected based on a first frequency sampled at a first time instant and a second frequency sampled at a second time instant and, a time interval between the first and second time instants. In addition, the first time instant may occur after a first high frequency oscillator 114 calibration and the second time instant may occur after a second high frequency oscillator 114 calibration. Furthermore, the first time instant may occur after a first high frequency oscillator 114 clock adjustment which may occur after the first high frequency oscillator 114 calibration.

The detected high frequency oscillator 114 frequency drift may be utilized to determine a time interval for adjusting the high frequency oscillator 114 sleep time interval. In this regard, the determined time interval may be based on two or more high frequency oscillator 114 calibrations and/or one or more high frequency oscillator 114 clock adjustments. The sleep time interval may be increased by adding a time delay to an expected time to wake the high frequency oscillator 114 and/or the high frequency oscillator 114 driven circuit 118. Also, the high frequency oscillator 114 and/or the high frequency oscillator 114 driven circuit 118 sleep time interval may be decreased by subtracting a time interval from the expected wake time. According to an embodiment of the invention, the circuit 118 driven by the high frequency oscillator 114 may be a radio circuit 118. The radio circuit 118 may be enabled to perform various tasks more quickly in instances when the time to wake the high frequency oscillator 114 circuit is more accurate due to the two or more low frequency oscillator 110 calibrations between the high frequency oscillator 114 sleep and wake cycles.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a method and system for drift reduction in a low power oscillator (LPO) utilized in a wireless communication device.

Accordingly, the present invention may be realized in hardware, software, or a combination of hardware and software. The present invention may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising: detecting a frequency drift of a low frequency oscillator; as compensation for the frequency drift detected, adjusting timing of said low frequency oscillator based on an output of a high frequency oscillator; and as further compensation for the frequency drift detected, adjusting a length of a sleep time interval for a circuit which is driven by the high frequency oscillator, based on said detected frequency drift of said low frequency oscillator and based on said adjustment of said low frequency oscillator, wherein the high frequency oscillator is deactivated during the sleep time interval and the sleep time interval is timed by the low frequency oscillator.

2. The method according to claim 1, the method comprising adjusting the sleep time interval for said circuit while said high frequency oscillator is driven by said low frequency oscillator.

3. The method according to claim 1, comprising calibrating said low frequency oscillator based on an output of said high frequency oscillator.

4. The method according to claim 1, comprising detecting said frequency drift based on a first frequency sampled at a first time instant and a second frequency sampled at a second time instant and a time interval between said first time instant and said second time instant.

5. The method according to claim 4, wherein said first time instant occurs after a first calibration of said low frequency oscillator and said second time instant occurs after a second calibration of said low frequency oscillator.

6. The method according to claim 5, wherein said first time instant occurs after a first low frequency oscillator clock adjustment that occurs after said first low frequency oscillator calibration.

7. The method according to claim 1, comprising determining a time interval for said adjusting said sleep time interval based on said detected frequency drift.

8. The method according to claim 7, comprising determining said time interval for said adjusting said sleep time interval based on two or more low frequency oscillator calibrations or one or more low frequency oscillator clock adjustments.

9. The method according to claim 8, comprising increasing said sleep time interval by adding a time delay to an expected time to wake said high frequency oscillator.

10. The method according to claim 8, comprising decreasing said sleep time interval by subtracting the time interval from an expected time to wake said high frequency oscillator.

11. The method according to claim 1, wherein said circuit driven by said high frequency oscillator is a radio circuit.

12. A system for signal processing, the system comprising: one or more circuits operable to:
detect a frequency drift of a low frequency oscillator based on an output of a high frequency oscillator;
as compensation for the frequency drift detected, adjust timing of said low frequency oscillator; and
as further compensation for the frequency drift detected, adjust a length of a sleep time interval for a circuit which is driven by a high frequency oscillator, based on said detected frequency drift of said low frequency oscillator and based on said adjustment of said low frequency oscillator, wherein the high frequency oscillator is deactivated during the sleep time interval and the sleep time interval is timed by the low frequency oscillator.

13. The system according to claim 12, wherein said one or more circuits enables adjustment of the sleep time interval for said circuit while said high frequency oscillator is driven by said low frequency oscillator.

14. The system according to claim 12, wherein said one or more circuits enables calibration of said low frequency oscillator based on an output of said high frequency oscillator.

15. The system according to claim 12, wherein said one or more circuits enables detection of said frequency drift based on a first frequency sampled at a first time instant and a second frequency sampled at a second time instant and a time interval between said first time instant and said second time instant.

16. The system according to claim 15 wherein said first time instant occurs after a first calibration of said low frequency oscillator and said second time instant occurs after a second calibration of said low frequency oscillator.

17. The system according to claim 16, wherein said first time instant occurs after a first low frequency oscillator clock adjustment that occurs after said first low frequency oscillator calibration.

18. The system according to claim 12, wherein said one or more circuits enables determination of a time interval for said adjusting said sleep time interval based on said detected frequency drift.

19. The system according to claim 18, wherein said one or more circuits enables determination of said time interval for said adjusting said sleep time interval based on two or more low frequency oscillator calibrations or one or more low frequency oscillator clock adjustments.

20. The system according to claim 19, wherein said one or more circuits enables an increase of said sleep time interval by adding a time delay to an expected time to wake said high frequency oscillator.

21. The system according to claim 19, wherein said one or more circuits enables a decrease of said sleep time interval by subtracting the time interval from an expected time to wake said high frequency oscillator.

22. The system according to claim 12, wherein said circuit driven by said high frequency oscillator is a radio circuit.

* * * * *